(12) United States Patent
Yamazaki et al.

(10) Patent No.: US 8,017,251 B2
(45) Date of Patent: Sep. 13, 2011

(54) ORGANIC ELECTROLUMINESCENT DEVICE

(75) Inventors: Kazuki Yamazaki, Kanagawa (JP); Masayuki Mishima, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 934 days.

(21) Appl. No.: 11/387,843

(22) Filed: Mar. 24, 2006

(65) Prior Publication Data

US 2006/0214568 A1      Sep. 28, 2006

(30) Foreign Application Priority Data

Mar. 28, 2005 (JP) ................. 2005-093316

(51) Int. Cl.
*H01L 51/54* (2006.01)
(52) U.S. Cl. ......... 428/690; 428/917; 313/504; 313/506
(58) Field of Classification Search .................. 428/690, 428/917; 313/504, 506
See application file for complete search history.

(56) References Cited

U.S. PATENT DOCUMENTS

| | | | |
|---|---|---|---|
| 2002/0197511 A1* | 12/2002 | D'Andrade et al. | 428/690 |
| 2004/0104394 A1* | 6/2004 | Lin et al. | 257/79 |
| 2004/0137268 A1* | 7/2004 | Igarashi et al. | 428/690 |
| 2005/0046337 A1* | 3/2005 | Chin et al. | 313/504 |

FOREIGN PATENT DOCUMENTS

| | | |
|---|---|---|
| JP | 2000-156290 A | 6/2000 |
| JP | 2001-319780 A | 11/2001 |
| JP | 2004-522276 A | 7/2004 |
| JP | 2004-241118 A | 8/2004 |
| JP | 2004-281087 A | 10/2004 |
| JP | 2006-24711 A | 1/2006 |

OTHER PUBLICATIONS

Notice of Reasons for Rejection dated Feb. 1, 2011 for Japanese Application No. 2005-363441.
Notice of Reasons for Rejection dated May 31, 2011 for Japanese Application No. 2005-363441.

* cited by examiner

*Primary Examiner* — D. Lawrence Tarazano
*Assistant Examiner* — Gregory Clark
(74) *Attorney, Agent, or Firm* — Birch, Stewart, Kolasch & Birch, LLP

(57) ABSTRACT

The invention provides an organic electroluminescent device having one or more organic compound layers between a pair of electrodes, the one or more organic compound layers including at least a luminescent layer, wherein a host material and at least two different luminescent materials including at least one phosphorescent material are contained in the same luminescent layer, and the luminescent layer has a region containing the host material and one luminescent material and a region containing the host material and at least two luminescent materials in the thickness direction of the luminescent layer.

7 Claims, 7 Drawing Sheets

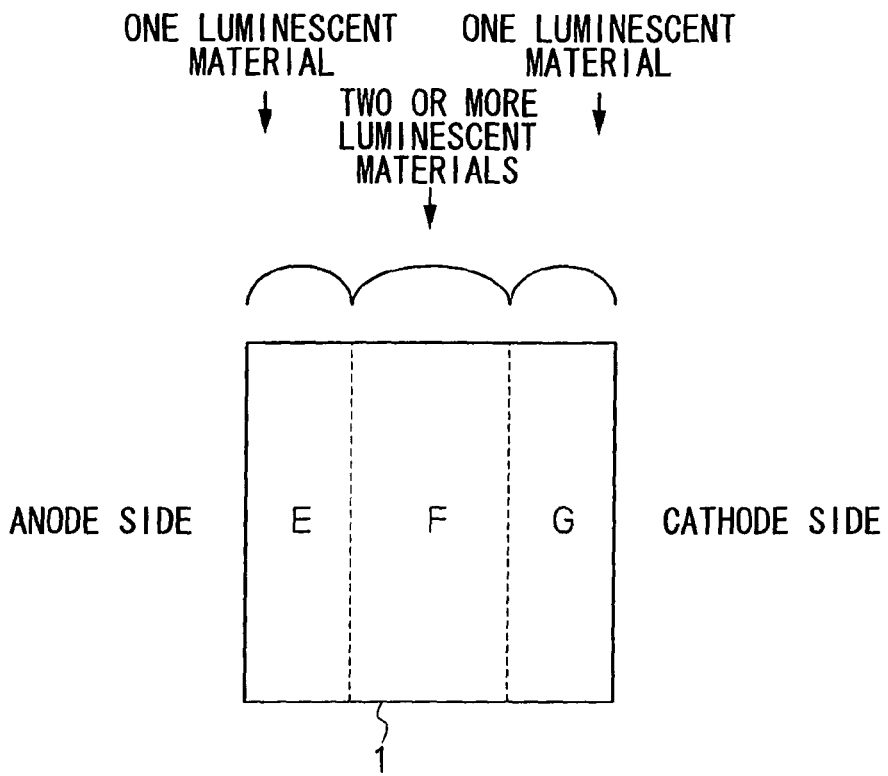
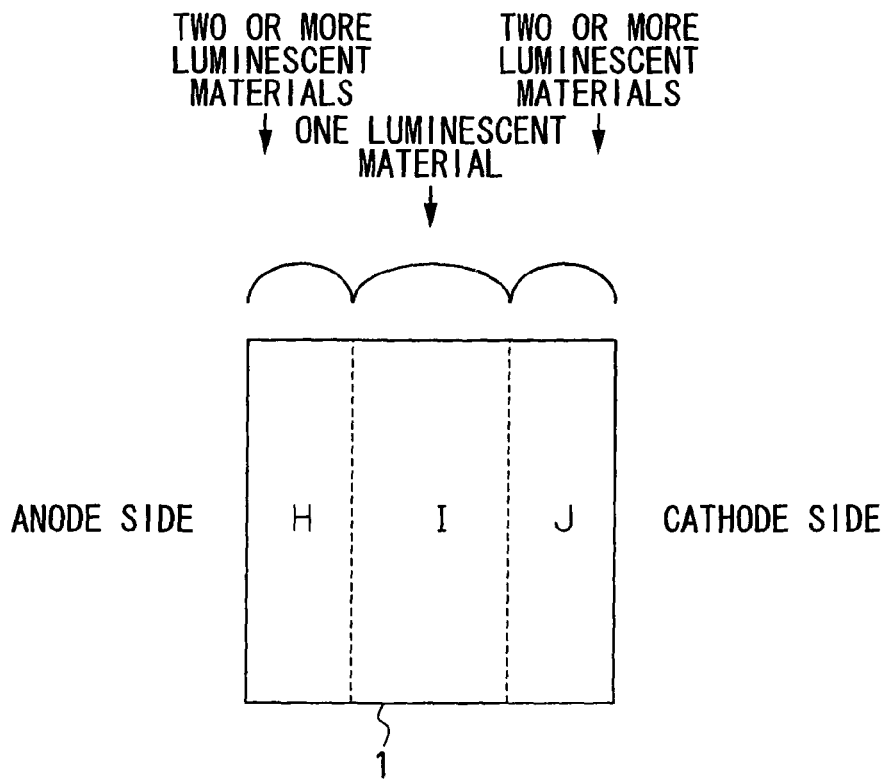

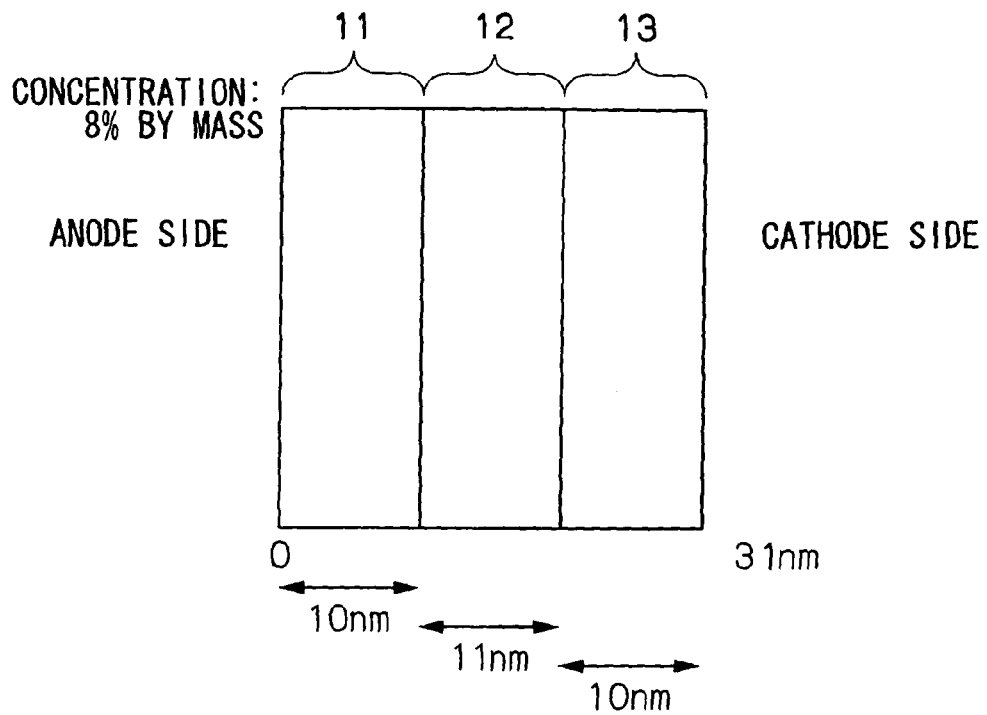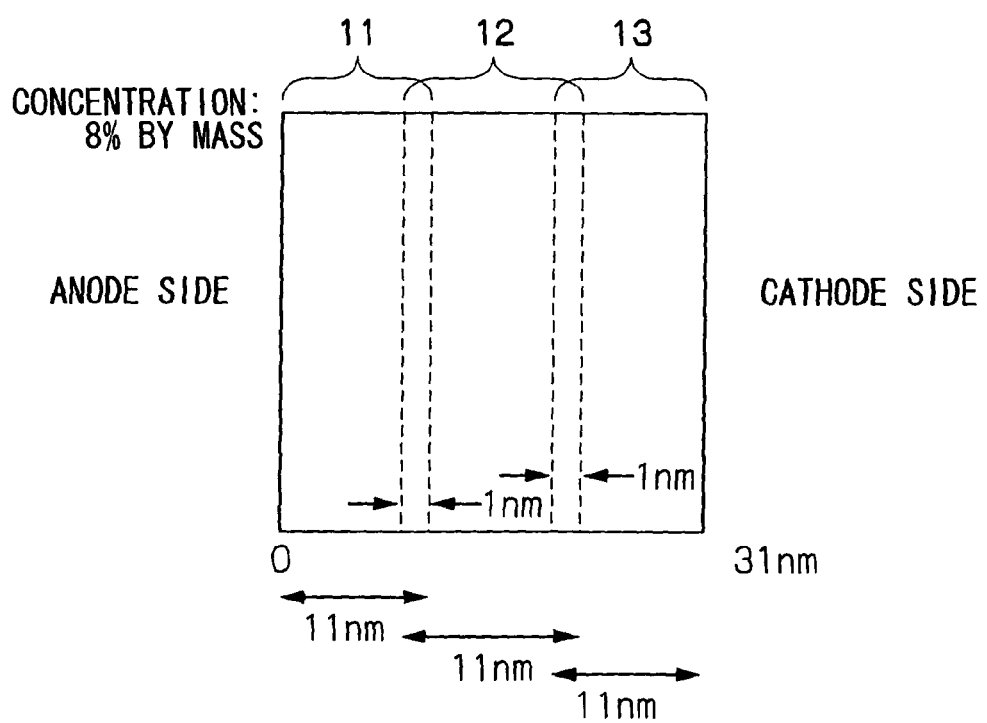

ORGANIC ELECTROLUMINESCENT DEVICE

CROSS-REFERENCE TO RELATED APPLICATION

This application claims priority under 35 USC 119 from Japanese Patent Application No. 2005-093316, the disclosure of which is incorporated by reference herein.

BACKGROUND OF THE INVENTION

1. Field of the Invention

The present invention relates to an organic electroluminescent device (luminescent device or EL device) that emits light by converting electric energy to light.

2. Description of the Related Art

Today, research and development on various display devices are being vigorously conducted. Among these, organic electroluminescent (EL) devices have attracted attention as promising display devices since light emission can be obtained with high luminance at low voltage.

Generally, organic EL devices have a pair of electrodes and a luminescent layer or a plurality of organic layers including a luminescent layer that are disposed between the electrodes, and emit light with the excitons generated by recombination of the electrons injected from a cathode and holes injected from an anode in the luminescent layer or with the excitons of other molecules generated by energy transfer from the excitons above.

The organic EL device is a self-luminous surface-light source, and may be used, for example, as a white light source. An ideal white light source has a coordinate pair (0.33, 0.33), as defined by Commission Internationale d'Eclairage (CIE). White light may be obtained based on the combination of luminescent materials in three colors of blue, green, and red. Alternatively, white light may be obtained based on the combination of luminescent materials in two complementary colors.

As a white luminescent device, one which emits white light with high luminance and high chromaticity at low voltage is desired. Use of a phosphorescent material, which has higher luminous efficiency than a fluorescent material, is preferable for reduction of operation voltage and improvement in luminance (see e.g., Japanese Patent Application Laid-Open (JP-A) Nos. 2001-319780, 2004-281087 and 2004-522276, the disclosures of which are incorporated by reference herein). In particular, there has been a need for development of a blue phosphorescent material and a device that emits light effectively from the blue phosphorescent material, for improvement in the luminous efficiency of luminescent devices. This is because, if the intensity of blue light is low, in order to obtain a light of desired chromaticity, it is necessary to lower and adjust the intensities of green and red phosphorescences that are known as being emitted at high efficiency, resulting in decrease in the luminous efficiency of the resulting luminescent device. Thus, conventional devices are still unsatisfactory in luminous efficiency and chromaticity, and further improvement is needed.

SUMMARY OF THE INVENTION

The present invention provides an organic electroluminescent device superior in luminous efficiency and brightness. It also provides a white organic electroluminescent device superior in luminous efficiency and brightness and favorable in chromaticity.

In view of the above circumstances, the inventors have studied intensively and completed the invention.

An aspect of the invention provides an organic electroluminescent device comprising one or more organic compound layers between a pair of electrodes, the one or more organic compound layers comprising at least a luminescent layer, wherein a host material and at least two different luminescent materials including at least one phosphorescent material are contained in the same luminescent layer, and the luminescent layer has a region containing the host material and one luminescent material and a region containing the host material and at least two luminescent materials in the thickness direction of the luminescent layer.

The organic electroluminescent device above may be an organic electroluminescent device wherein a host material and two different luminescent materials including at least one phosphorescent material are contained in the same luminescent layer, and the luminescent layer has a region containing the host material and the first luminescent material, a region containing the host material and the first and second luminescent materials, a region containing the host material and the second luminescent material formed in this order in the thickness direction from an anode side of the luminescent layer.

Alternatively, the organic electroluminescent device may be an organic electroluminescent device wherein a host material and three different luminescent materials including at least one phosphorescent material are contained in the same luminescent layer and the luminescent layer has a region containing the host material and the first luminescent material, a region containing the host material and the first and second luminescent materials, a region containing the host material and the second luminescent material, a region containing the host material and the second and third luminescent materials, a region containing the host material and the third luminescent material formed in this order in the thickness direction from an anode side of the luminescent layer.

BRIEF DESCRIPTION OF THE DRAWINGS

FIGS. 2A and 2B are schematic views respectively illustrating a luminescent layer in two other embodiments of the luminescent device according to the invention. FIG. 2A is a schematic view illustrating a luminescent layer having a region containing two or more luminescent materials disposed between regions containing one luminescent material. FIG. 2B is a schematic view illustrating a luminescent layer having a region containing one luminescent material disposed between regions containing two luminescent materials.

FIG. 6 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in the luminescent device of Comparative Example 1.

FIG. 7 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa in the luminescent device of Example 1.

DETAILED DESCRIPTION OF THE INVENTION

Hereinafter, the present invention will be described in detail.

The luminescent device according to the invention has at least an anode, one or more organic compound layers including a luminescent layer, and a cathode, which may be formed on a supporting substrate, wherein a host material and two or more different luminescent materials including at least one phosphorescent material are contained in the same luminescent layer, and the luminescent layer has a region containing the host material and one luminescent material and a region containing the host material and two or more luminescent materials in the thickness direction of the luminescent layer.

Hereinafter, the invention will be described in detail with reference to FIGS. 1 to 5. In FIGS. 1 to 5, 1 represents a luminescent layer.

Figure 1A:
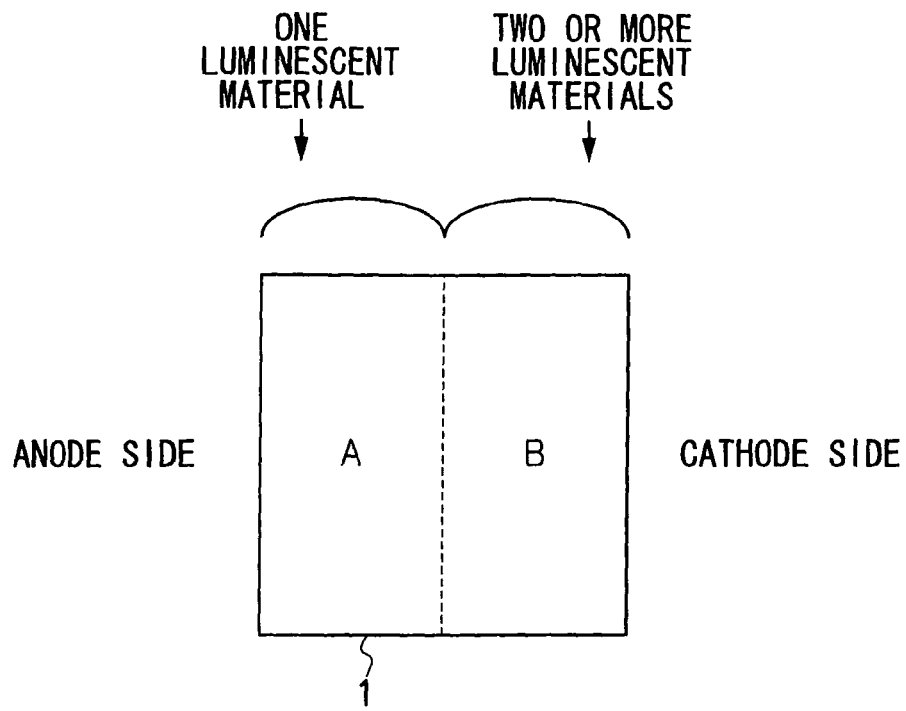
FIGS. 1A and 1B are schematic views respectively illustrating distribution of luminescent materials in a luminescent layer in two embodiments of the luminescent device according to the present invention.
Figure 1B:
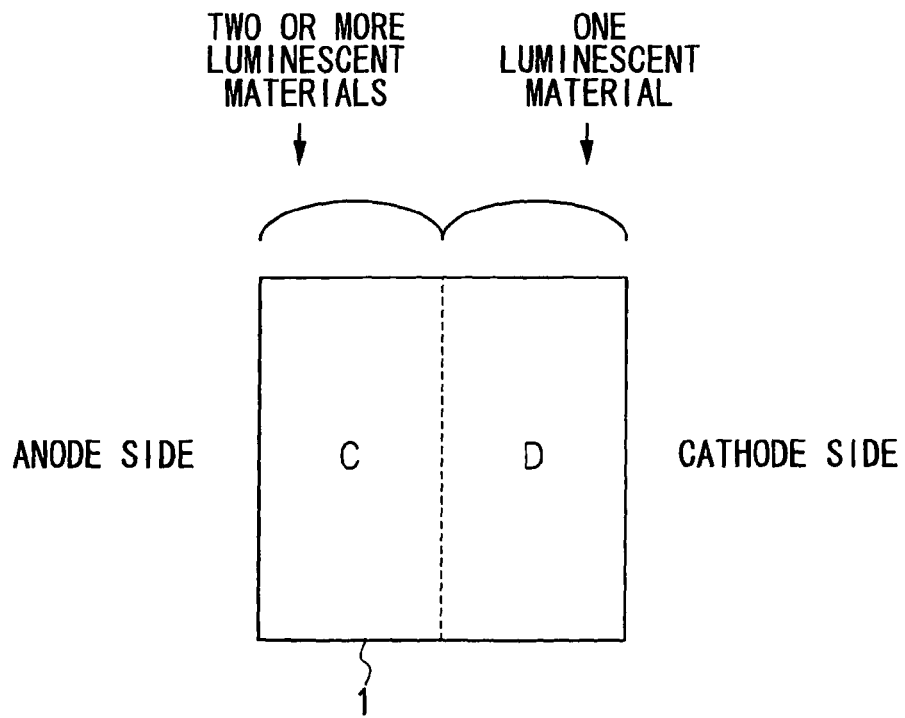

FIGS. 1A and 1B are schematic views respectively illustrating distribution of the luminescent materials in the luminescent layer in embodiments of the luminescent device according to the invention. Alternatively, FIGS. 2A and 2B are schematic views respectively illustrating distribution of the luminescent materials in the luminescent layer in other embodiments of the luminescent device according to the invention. The luminescent device according to the invention has a region containing the host material and one luminescent material and a region containing the host material and two or more luminescent materials in the thickness direction of the luminescent layer. As shown in FIGS. 1A and 1B, the configurations "having regions containing the host material and one luminescent material and a region containing the host material and two or more luminescent materials in the thickness direction of the luminescent layer" include, for example, a configuration having a region A containing the host material and one luminescent material in the anode side of the luminescent layer and a region B containing the host material and two or more luminescent materials in the cathode side thereof (FIG. 1A), and its opposite configuration having a region C containing the host material and two or more luminescent materials in the anode side of the luminescent layer and a region D containing the host material and one luminescent material in the cathode side (FIG. 1B).

As shown in FIGS. 2A and 2B, the configurations "having regions containing the host material and one luminescent material and a region containing the host material and two or more luminescent materials in the thickness direction of the luminescent layer" also include a configuration having a region F containing the host material and two or more luminescent materials and regions E and G each containing the host material and one luminescent material, wherein the region F is disposed between the regions E and G and the regions E and G are disposed respectively in the anode side and the cathode side of the luminescent layer (FIG. 2A), and its opposite configuration having a region I containing the host material and one luminescent material and regions H and J each containing the host material and two or more luminescent materials, wherein the region I is disposed between the regions H and J and the regions H and J are disposed respectively in the anode side and cathode side of the luminescent layer (FIG. 2B).

Figure 3A:
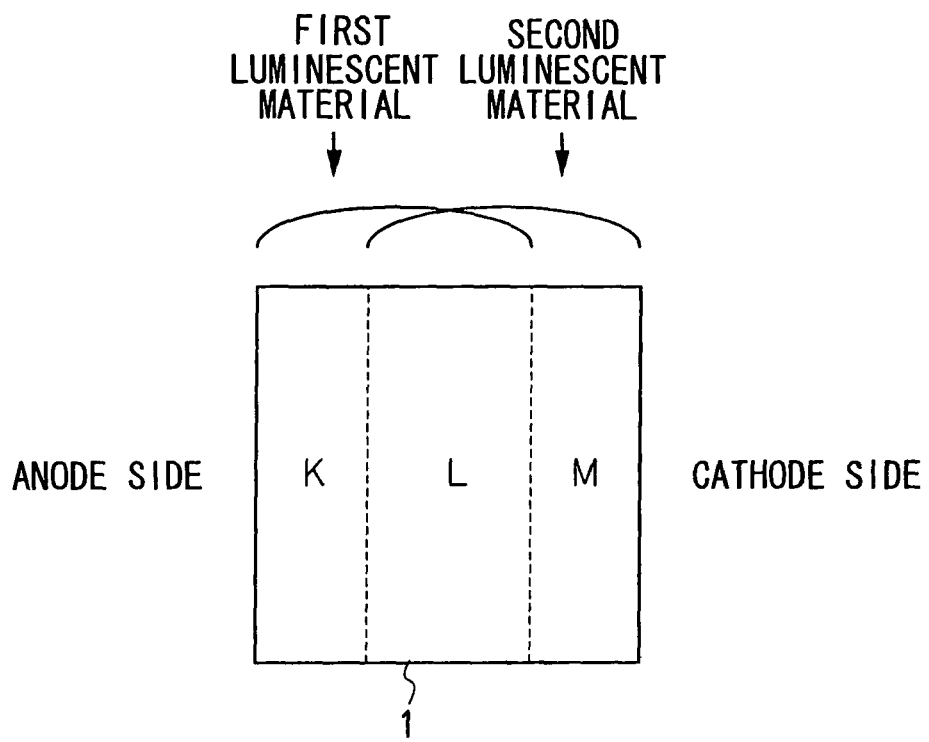
FIG. 3A is a schematic view illustrating distribution of luminescent materials in a luminescent layer in yet another embodiment of the luminescent device according to the invention.
Figure 3B:
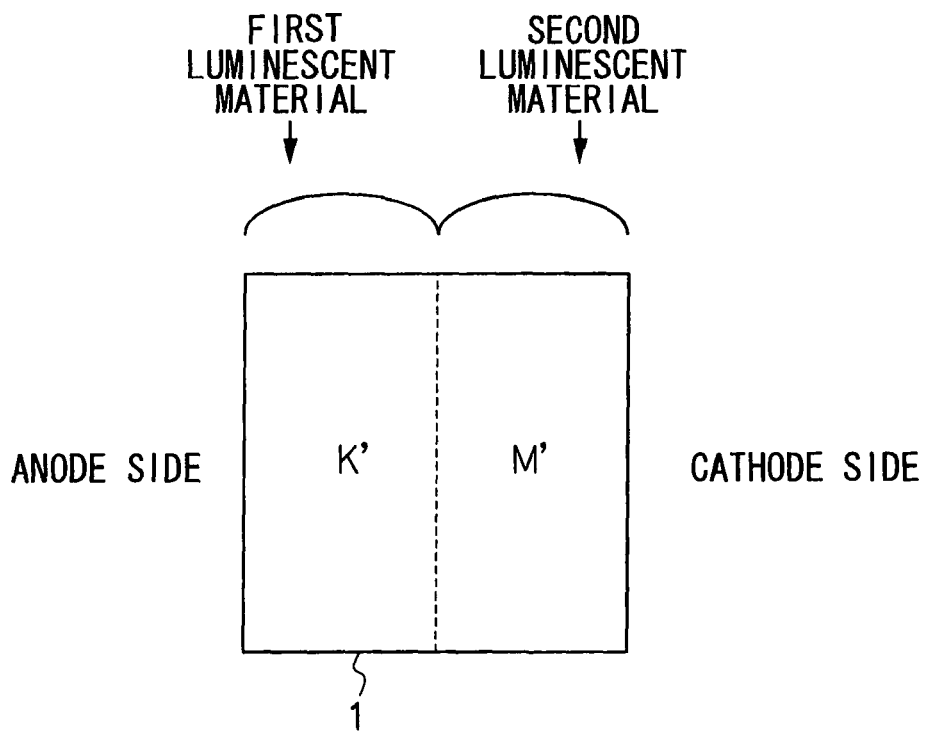
FIG. 3B is a schematic view illustrating distribution of luminescent materials in a luminescent layer in a conventional luminescent device.

FIG. 3A is a schematic view illustrating distribution of the luminescent materials in the luminescent layer in another embodiment of the luminescent device according to the invention. FIG. 3B is a schematic view illustrating distribution of the luminescent materials in the luminescent layer in an embodiment of conventional luminescent device.

It is preferable to use two luminescent materials different in emission wavelength in the invention for obtaining white emission favorable in chromaticity. In such a case, the luminescent layer preferably has, for example, a configuration having a region K containing the host material and the first luminescent material, a region L containing the host material and the first and second luminescent materials, and a region M containing the host material and the second luminescent material formed in this order in the thickness direction from the anode side of the light-emitting, as shown in FIG. 3A.

In such a configuration, it is possible to reduce the charge transfer barrier present at the interface between a region K' containing the host material and the first luminescent material and a region M' containing the host material and the second luminescent material, which is shown in FIG. 3B illustrating a conventional luminescent device, and improve the charge-transporting property between regions K' and M' and thus the luminous efficiency of device.

The ratio of the host material to the luminescent materials and the contents of the luminescent materials in the regions K, L, and M may be the same as those for the regions E, F, and G described above.

Figure 4:
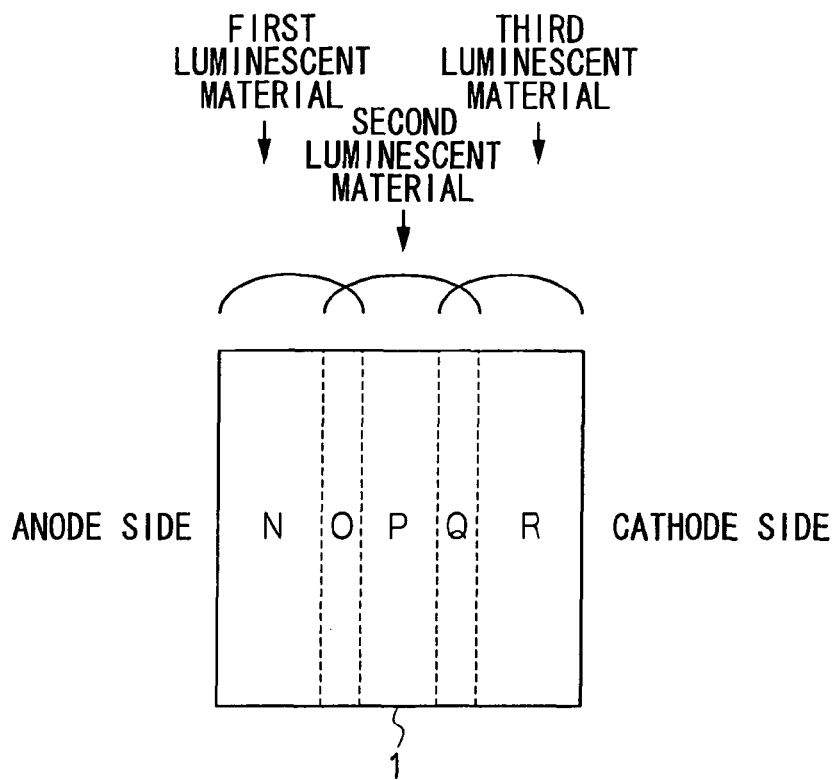
FIG. 4 is a schematic view illustrating distribution of luminescent materials in a luminescent layer in yet another embodiment of the luminescent device according to the invention.

FIG. 4 is a schematic view illustrating distribution of the luminescent materials in the luminescent layer in yet another embodiment of the luminescent device according to the invention.

In the invention, it is more preferable to use three luminescent materials different in emission wavelength for obtaining white emission further favorable in chromaticity. In such a case, as shown in FIG. 4, the luminescent layer particularly preferably has, for example, a configuration having a region N containing the host material and the first luminescent material, a region O containing the host material and the first and second luminescent materials, a region P containing the host material and the second luminescent material, a region Q containing the host material and the second and third luminescent materials, and a region R containing the host material and the third luminescent material formed in this order in the thickness direction from the anode side of the luminescent layer.

The thickness of the various regions (e.g., regions A to M in FIGS. 1 to 3 and regions N to R in FIG. 4) in the luminescent layer may be adjusted properly according to the desirable performance of final device.

The thickness of the regions containing two or more luminescent materials (e.g., regions B, C, F, H, J, L, O, and Q in FIGS. 1 to 4) may vary according to the kinds and concentrations of the luminescent materials contained therein, but, when the concentrations of the luminescent materials are too low, an excessively lower thickness may prohibit desirable advantageous effects, while an excessively large thickness may lead to increase in driving voltage or deterioration in luminous efficiency. When the concentrations are too high, an excessively large thickness may lead to deterioration in chromaticity due to energy transfer among luminescent materials.

Thus, the thickness of the region containing two or more luminescent materials is preferably 0.5 nm to 10 nm, more preferably 0.5 nm to 5 nm, and still more preferably 0.5 nm to 2 nm, from the viewpoints of driving voltage and luminous efficiency. The concentration of each luminescent material in the region containing two or more luminescent materials is preferably 0.5% by mass to 5% by mass, and more preferably 0.5% by mass to 3% by mass, from the same viewpoints above.

The mass ratio of the luminescent materials is preferably 1:10 to 10:1 in the region containing two or more luminescent materials.

On the other hand, the concentration of the luminescent material in the region containing only one luminescent material may be higher or lower than the concentrations in the region containing two or more luminescent materials, taking its luminous efficiency into account.

That is, it is possible to have a concentration distribution in which the concentration of the luminescent material in the luminescent layer is gradually increasing and/or decreasing in the thickness direction. An example of the concentration distribution is shown in FIG. 5.

Figure 5:
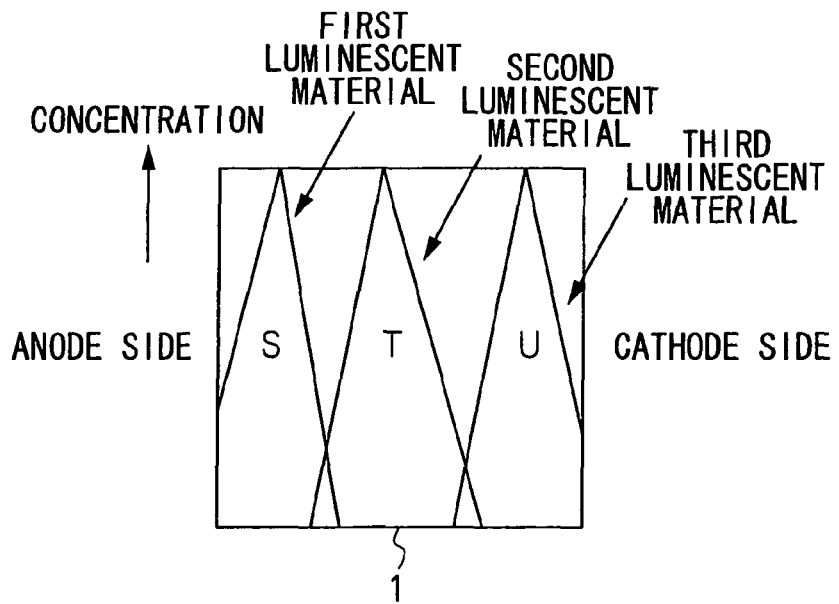
FIG. 5 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in yet another embodiment of the luminescent device according to the invention.

The ordinate in FIG. 5 schematically represents the concentration of the luminescent material in the luminescent layer. The region containing the host material and the first luminescent material, the region containing the host material and the second luminescent material, and the region containing the host material and the third luminescent material will be described below respectively, as first luminescent region S, second luminescent region T, and third luminescent region U.

In the first luminescent region S, the concentration of the first luminescent material increases gradually from the anode side until it reaches the maximum value and then decreases gradually. Then in the second luminescent region T, the concentration of the second luminescent material increases and then decreases gradually. Further, in the third luminescent region U, the concentration of the third luminescent material increases and then decreases gradually.

Although the concentration increases and decreases gradually in the shape of (1) primary straight line in FIG. 5, the pattern of the increase in concentration to the maximum value is not particularly limited. That is, in the region S, (2) the slope of the change in the concentration (concentration gradient) of the first luminescent material may be smaller at the start of vapor deposition and then may be raised gradually, or alternatively, (3) the slope of the change in concentration of the first luminescent material may be larger at the start of vapor deposition and then may be lowered.

The slope of the change in the concentration of the decrease from the maximum value may also be changed in a similar manner to above. Thus, (4) the slope of concentration decrease after the concentration of the first luminescent material reached the maximum value in the region S may be smaller at first and then raised gradually, or alternatively, (5) the slope of concentration decrease after the concentration of the first luminescent material reached the maximum value may be larger at first and then lowered gradually. Yet alternatively, a combination thereof is also possible.

Alternatively, the gradual increase or decrease in concentration may be stepwise. That is, "the increase or decrease in the shape of primary straight line increase or decrease" in FIG. 5 (1) may be replaced with "stepwise increase or decrease" (6). Similarly, the "stepwise increase or decrease" may be any one of the types (2) to (5). Alternatively, any combination thereof is also possible.

The luminescent layer thus prepared has a layer structure including a region S containing the first luminescent material, a region S+T containing the first and second luminescent materials, a region T containing the second luminescent material, a region T+U containing the second and third luminescent materials, and a region U containing the third luminescent material in this order from the anode side.

In the description above, all of three luminescent materials, the first to third materials, each have a concentration distribution, but only one or two of the luminescent materials may have a concentration distribution. It is the case when the luminescent layer includes three regions S, S+U, and U, and the concentration distribution of the luminescent materials therein may be made similar to that when three kinds of luminescent materials are used.

The initial concentration of the first luminescent material shown in FIG. 5 is not particularly limited, and may be any value in the range of 0 to 100% by mass.

Among the embodiments described above, the embodiments as shown in FIGS. 2A, 2B, 4 and 5 are more preferable, and the embodiment as shown in FIG. 5 is still more preferable.

The luminescent layers exemplified in FIGS. 1 to 5 can be prepared, for example, by adjusting the speeds of depositing the host material and the luminescent materials properly, when a vapor deposition method is used for preparation. Hereinafter, an example of the method of forming the luminescent layers will be described with reference to FIG. 4, but the invention is not limited thereto.

(Vapor Deposition of Luminescent Layer)

Components for layer N including the first luminescent material are vapor-deposited on a substrate. When the deposition layer reaches to a particular thickness during vapor deposition, vapor-deposition of components for layer P including the second luminescent material is started, and thus, a mixed layer O is formed since then. When the layer O reaches to a desired thickness, vapor-deposition of the components for layer N is completed.

Then, after initiation of vapor deposition of the second luminescent layer and when the thickness of the second luminescent layer reaches a particular thickness (total thickness including the first luminescent layer also reaches to a particular thickness) at which a layer Q is to be formed, vapor-deposition of components for layer R including the third luminescent material is started, and thus, the mixed layer Q is formed since then. When the layer Q is deposited to a desired thickness, vapor-deposition of the components for layer P is completed.

Further, when the layer R is deposited to a particular thickness, vapor-deposition of the layer R is completed. Vapor-deposition of the respective components for the layers N to R can be controlled by adjusting the deposition speeds and the concentrations of respective luminescent materials properly. In this manner, a luminescent layer having layers N, O, P, Q, and R from the anode side can be prepared.

The substrate, anode and cathode for use in the invention are not particularly limited, and any one of known products may be used; but at least one electrode, anode or cathode, is preferably transparent, because it is used in a luminescent device.

As for the structure the organic compound layers according to the invention, in a preferred embodiment, a hole-transporting layer, a luminescent layer, and an electron-transporting layer are disposed in this order from the anode side. A charge-blocking layer or the like may be disposed between the hole-transporting layer and the luminescent layer or between the luminescent layer and the electron-transporting layer. A hole-injecting layer may be disposed between the anode and the hole-transporting layer. An electron-injecting layer may be disposed between the cathode and the electron-transporting layer.

The luminescent layer is a layer having functions of receiving holes from the anode, hole-injecting layer, or hole-transporting layer, receiving electrons from the cathode, electron-injecting layer, or electron-transporting layer, and emitting light by providing the site for recombination of the holes and electrons, under application of an electric field.

The luminescent layer according to the invention may contain only one host material or two or more of them, and an example of the configuration containing two or more host materials is a combination of an electron-transporting host material and a hole-transporting host material. The luminescent layer may contain a host material having no charge-transporting property and emitting no light.

The material for use as the host material is not particularly limited, and any one of known materials may be used as it is selected properly. For example, materials used for the electron-transporting layer and the electron-injecting layer and materials used for the hole-transporting layer and the hole-injecting layer may be used favorably, respectively as the electron-transporting host materials and the hole-transporting host materials.

Preferable examples of the host materials include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphiryn-based compound, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, anhydrides of aromatic tetracarboxylic acid (examples of aromatic ring thereof include naphthalene and perylene), phthalocyanine derivatives, various metal complexes as represented by a metal complex of 8-quinolinol derivative, metal phthalocyanine and a metal complex with the ligand being benzoxazole or benzothiazole, and polymer compounds such as polysilane-based compounds, poly(N-vinylcarbazole) derivatives, aniline-based copolymers, thiophene oligomers, electrically conductive high molecular weight oligomers such as polythiophene, polythiophene derivatives, polyphenylene vinylene derivatives, polyfluorene derivatives, and the like. These may be used singly or may be used in combination of two or more thereof.

The luminescent device according to the invention contains two or more luminescent materials including at least one phosphorescent material and a host material in the same luminescent layer.

The phosphorescent material is not particularly limited, and any one of known materials may be used as it is selected properly. Examples thereof include those described in JP-A No. 2004-221068, paragraph Nos. [0051] to [0057], the disclosure of which is incorporated by reference herein, and others; and among them, orthometalated metal complexes and a porphyrin metal complexes are preferable.

The orthometalated metal complex is the generic term indicating the compounds described, for example, in Akio Yamamoto, "Yuki Kinzoku Kagaku—Kiso to Oyo—(Organometallic Chemistry—Principles and Applications—)" p. 150 and p. 232, published by Shokabo (1982); H. Yersin, "Photochemistry and Photophysics of Coordination Compounds" pp. 71 to 77 and 135 to 146, published by Springer-Verlag (1987); the disclosures of which are incorporated by reference herein, and others. Use of an orthometalated metal complex as the luminescent material in luminescent layer is advantageous, from the point of the high luminance and the high luminous efficiency of the resulting device.

There are various ligands that form the orthometalated metal complex and examples thereof are described in the literatures above; and among them, preferable ligands include 2-phenylpyridine derivatives, 7,8-benzoquinoline derivatives, 2-(2-thienyl)pyridine derivatives, 2-(1-naphthyl)pyridine derivatives, 2-phenylquinoline derivatives and the like. These derivatives may have substituents as needed. In addition, the orthometalated metal complex may have a ligand other than those described above.

The orthometalated metal complex for use in the invention can be prepared according to the various known methods described, for example, in Inorg. Chem., 1991, 30, p. 1685; ibid., 1988, 27, p. 3464; ibid., 1994, 33, p. 545; Inorg. Chim. Acta, 1991, 181, p. 245; J. Organomet. Chem., 1987, 335, p. 293; J. Am. Chem. Soc. 1985, 107, p. 1431; and others. Among the orthometalated complexes above, compounds emitting light from the triplet exciton state are used favorably in the invention, for the purpose of improving luminous efficiency. Among porphyrin metal complexes, porphyrin platinum complexes are preferable.

The content of the luminescent material in luminescent layer is not particularly limited, however, when a phosphorescent material is used as the luminescent material, the content of the luminescent material is preferably 0.1 to 40% by mass, more preferably, 0.5 to 20% by mass, in one luminescent material layer (luminescent material region). When a fluorescent material is used as the luminescent material, only the fluorescent material may be used favorably for forming a luminescent material layer (luminescent material region), or alternatively, a mixture of the fluorescent material and a host material may be used favorably for forming the luminescent material layer (luminescent material region). In the mixed layer (mixed region) containing a host material and a fluorescent material, the concentration of the fluorescent material in one luminescent layer is preferably 0.1 to 99.9% by mass, more preferably 1 to 99% by mass, and still more preferably 10 to 90% by mass.

The content of the host material in the luminescent layer is not particularly limited, but preferably 0.1 to 99.9% by mass, more preferably 60 to 99.9% by mass, and particularly preferably 80 to 99.5% by mass.

In the invention, it is possible to obtain a luminescent device in any color, by using at least two different luminescent materials including at least one of the phosphorescent materials. The luminescent device according to the invention is preferably a white luminescent device. It is preferable to use at least two different luminescent materials including at least one of the phosphorescent materials, more preferably three or more luminescent materials, in the white luminescent device, for producing a white luminescent device higher in luminous efficiency and brightness.

In the invention, the at least two different luminescent materials above preferably have different emission wavelengths; and, for example, it is possible to obtain a white luminescent device by using two luminescent materials of complementary colors, a blue luminescent material and an orange luminescent material.

In addition, the three different luminescent materials preferably emit lights different in emission wavelength; and for example, it is possible to obtain a white luminescent device by using three or more different luminescent materials, for example, blue, green, and red luminescent materials, as properly chosen.

The blue luminescent material preferably has an emission wavelength of 400 to 500 nm; the green luminescent material preferably has an emission wavelength of 500 to 570 nm; and the red luminescent material preferably has an emission wavelength of 580 to 670 nm. It is possible to obtain a white luminescent device by using these two or more luminescent materials in the luminescent layer of organic compound layer. These luminescent materials may be chosen properly from the materials described above.

In the invention, it is possible to use a fluorescent material in combination with the phosphorescent material. The fluorescent material for use in the invention is not particularly limited, and any one of known fluorescent materials may be used as it is selected properly. Examples thereof include those described in JP-A No. 2004-146067, paragraph No. [0027], JP-A No. 2004-103577, paragraph No. [0057], the disclosures of which are incorporated by reference herein, and others, but the invention is not limited thereto.

As for a combination of the host material and the luminescent materials in the invention, it is more preferable to select the host material and the luminescent materials from preferable examples thereof respectively.

The components described in, for example, JP-A No. 2004-221068, paragraph Nos. [0013] to [0082], JP-A No. 2004-214178, paragraph Nos. [0017] to [0091], JP-A No. 2004-146067, paragraph Nos. [0024] to [0035], JP-A No. 2004-103577, paragraph Nos. [0017] to [0068], JP-A No. 2003-323987, paragraph Nos. [0014] to [0062], JP-A No. 2002-305083, paragraph Nos. [0015] to [0077], JP-A No. 2001-172284, paragraph Nos. [0008] to [0028], JP-A No. 2000-186094, paragraph Nos. [0013] to [0075], JP-A No. 2003-515897, paragraph Nos. [0016] to [0118], the disclosures of which are incorporated by reference herein, and others may be used as the components, such as substrate, electrode, organic layers, and other layers, for the organic electroluminescent device according to the invention, but the invention is not limited thereto.

In order to adjust a balance of charges in the device or control the driving durability, the hole-injecting layer or the hole-transporting layer may contain an electron-accepting dopant. Any material such as an inorganic compound or an organic compound can be used as the electron-accepting dopant contained in the hole-injecting layer or the hole-transporting layer as long as it has electron-accepting properties and is capable of oxidizing organic compounds.

Preferable examples thereof among inorganic electron-accepting compounds include metal halides such as ferric chloride, aluminum chloride, gallium chloride, indium chloride and antimony pentachloride, metal oxides such as vanadium pentoxide and molybdenum trioxide.

Preferable examples thereof among organic electron-accepting compounds include compounds having a nitro group, a halogen, a cyano group, a trifluoromethyl group or the like as a substituent thereof, quinone compounds, acid anhydride compounds, and fullerenes.

Preferable examples thereof further include compounds described in JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643, the disclosures of which are incorporated by reference herein, and the like.

These electron-accepting dopants may be used singly or in combination of two or more thereof. The amount of the electron-accepting dopant used in the hole-injecting layer or the hole-transporting layer may vary depending on a material thereof. It is preferably in a range of 0.01 to 50% mass, more preferably in a range of 0.05 to 20% by mass, and still more preferably in a range of 0.1 to 10% by mass, with respect to materials constituting the hole-injecting layer or the hole-transporting layer.

In order to adjust a balance of charges in the device or control the driving durability, the electron-injecting layer or the electron-transporting layer may contain an electron-donating dopant. Any materials can be used as the electron-donating dopant contained in the electron-injecting layer or the electron-transporting layer as long as it has electron-donating properties and is capable of reducing organic compounds. Preferable examples of the electron-donating dopants include alkali metals such as Li, alkaline earth metals such as Mg, transition metals including rare earth metals, and reductive organic compounds. Metals having a work function of 4.2 eV or less may be preferably used. Specific examples thereof include Li, Na, K, Be, Mg, Ca, Sr, Ba, Y, Cs, La, Sm, Gd and Yb. Specific examples of the reductive organic compounds include nitrogen-containing compounds, sulfur-containing compounds and phosphorus-containing compounds.

Specific examples of the electron-donating dopants further include materials described in JP-A Nos. 6-212153, 2000-196140, 2003-68468, 2003-229278, 2004-342614, the disclosures of which are incorporated by reference herein, and the like.

These electron-donating dopants may be used singly or in combination of two or more thereof. The amount of the electron-donating dopant used in the electron-injecting layer or the electron transporting layer may vary depending on a material thereof. It is preferably in a range of 0.1 to 99% by mass, more preferably in a range of 1.0 to 80% by mass, and still more preferably in a range of 2.0 to 70% by mass, with respect to materials constituting the electron-injecting layer or the electron-transporting layer.

In the organic electroluminescent device according to the invention, a DC voltage (which, may contain an altering current component as needed) voltage (usually in a range of 2 to 15 V) or a DC current is applied between the anode and the cathode, whereby the light emission can be obtained.

An important characteristic value of the organic electroluminescent device is external quantum efficiency (luminous efficiency). The external quantum efficiency is defined by the following Formula: "External quantum efficiency$\phi$=Number of photons emitted from device/Number of electrons injected into device". The larger this value, the more advantageous the device is from the point of the power consumption.

The external quantum efficiency is preferably 6% or more, particularly preferably 12% or more, for reduction of power consumption and improvement of driving durability.

The maximum value of external quantum efficiency when the device is driven at 20° C. or the value of external quantum efficiency when the device is driven at around 100 to 300 $cd/m^2$ (preferably, 200 $cd/m^2$) at 20° C. may be used as the value of external quantum efficiency.

The external quantum efficiency of luminescent device can be determined by measuring the luminance, emission spectrum, and current density of the device and calculating the results with the relative luminosity curve. Namely, the number of inputted electrons can be calculated by using the current density. Then the luminance can be converted into the number of photons emitted, by integral calculation using the emission spectrum and the relative luminosity curve (spectrum). Thus, the external quantum efficiency (%) can be calculated according to the Formula: "(Number of photons emitted/Number of electrons inputted into device)×100".

In the invention, the light-emitting capacity (luminance) can be determined by applying a constant DC voltage to the EL device by using a source measure unit (trade name: MODEL 2400) manufactured by Toyo Corporation and measuring the light therefrom by using a spectral radiance meter (trade name: SR-3) manufactured by Topcon Corporation. The maximum luminance and the driving power at the maximum luminance are determined, and the luminous efficiency at 1000 $cd/m^2$ can be used as the external quantum efficiency. In addition, a CIE chromaticity coordinate pair (x, y) can be determined from the emission spectrum.

The methods of driving organic electroluminescent device described in JP-A Nos. 2-148687, 6-301355, 5-29080, 7-134558, 8-234685, and 8-241047, Japanese Patent 2784615, U.S. Pat. Nos. 5,828,429 and 6,023,308, the disclosures of which are incorporated by reference herein, and others may be used as the methods of driving the organic electroluminescent device according to the invention.

The luminescent device according to the invention can be used suitably in the field of display devices, displays (e.g., full color displays), backlights, electrophotography, light sources for illumination, light sources for recording (e.g., light source arrays), light sources for exposure, light sources for reading, sings, signboards, interiors, optical communications, and the like.

EXAMPLES

Hereinafter, the present invention will be described with reference to Examples, but it should be understood that the invention is not limited thereby. "%" and "part" below means "% by mass" and "part by mass" respectively, unless specified otherwise. FIGS. 6 to 11 are schematic views illustrating the layer structure of the luminescent layers respectively obtained in Comparative Example 1, Examples 1 and 2, Comparative Example 2, and Examples 3 and 4 and showing the concentration distribution of the luminescent materials in the luminescent layers, as the concentration (% by mass) of the luminescent materials and the thickness of the luminescent layer are plotted respectively on the ordinate and the abscissa. In FIGS. 6 to 11, 11 represents the first luminescent material layer; 12 represents the second luminescent material layer; and 13 represents the third luminescent material layer.

Comparative Example 1 (See FIG. 6)

A glass plate (manufactured by Geomatec, surface resistance: 10 $\Omega$/sq) having an ITO film of 0.5 mm in thickness and 2.5 cm square was placed in a washing container, washed in 2-propanol by ultrasonication, and then subjected to a UV-ozone treatment for 30 minutes. BAYTRON P (PEDOT-PSS solution, polyethylenedioxythiophene doped with polystyrenesulfonic acid, manufactured by Bayer) was spin-coated on the UV/ozone-treated ITO substrate (4000 rpm, 40 sec) and dried at 120° C. for 10 minute under vacuum. The thickness of the PEDOT-PSS layer was 40 nm.

The following organic layers were deposited on the PEDOT-PSS layer one by one by vacuum deposition. As shown in FIG. 6, the luminescent layer was prepared by depositing the first luminescent material layer 11, the second luminescent material layer 12, and the third luminescent material layer 13 in this order from the anode side.

The deposition speed in the Examples of the invention was 0.2 nm/sec, unless specified otherwise. The deposition speed was determined by using a quartz oscillator. The thickness described below was also determined by using a quartz oscillator.

(Hole-Transporting Layer)

NPD, thickness: 40 nm (Luminescent Layer)

—First Luminescent Material Layer—

Layer 11 (CBP: 92%, Firpic: 8%), thickness: 10 nm

—Second Luminescent Material Layer—

Layer 12 (CBP: 92%, $Btp_2Ir(acac)$: 8%), thickness: 11 nm

—Third Luminescent Material Layer—

Layer 13 (CBP: 92%, $Ir(Ppy)_3$: 8%), thickness: 10 nm (Electron-Transporting Layer)

BCP, thickness: 10 nm

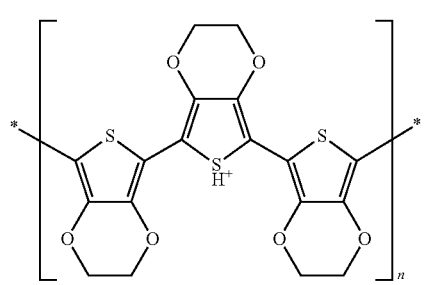

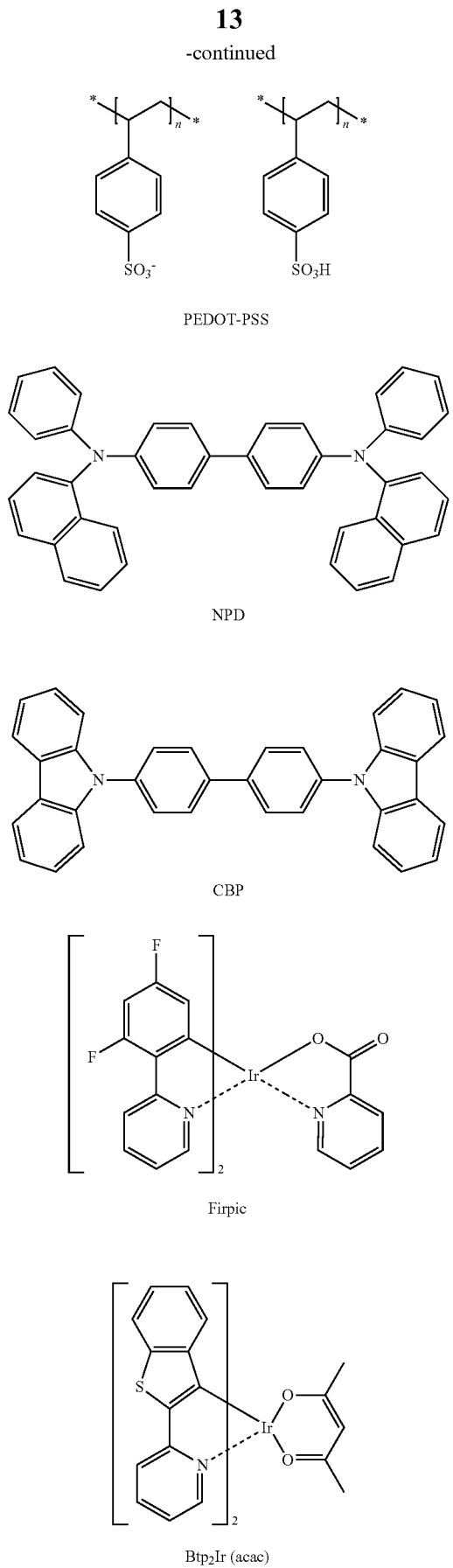

PEDOT-PSS

NPD

CBP

Firpic

Btp2Ir (acac)

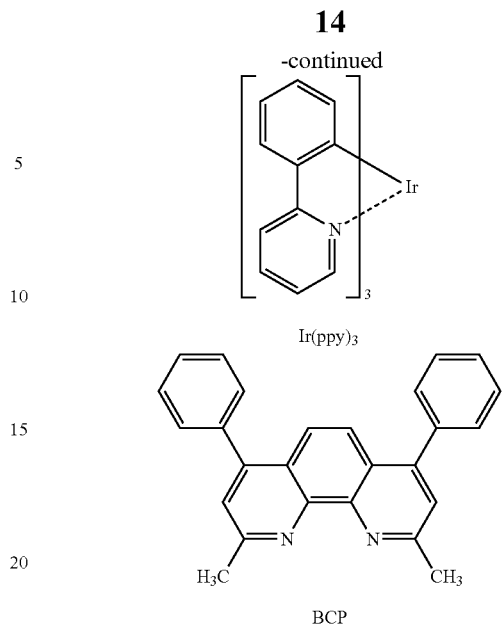

Ir(ppy)3

BCP

Then, a patterned mask (such a mask as to give a luminescent region of 2 mm×2 mm) was placed on the electron-transporting layer, and lithium fluoride was vapor-deposited to a thickness of 0.5 nm at a deposition speed of 0.1 nm/sec, to form an electron-injecting layer. Finally, metal aluminum was vapor-deposited to a thickness of 100 nm, forming a cathode.

The device was placed in a glove box in which air was replaced with argon gas, without exposure to air, and sealed in an stainless steel-made sealing container by using an ultraviolet-curable adhesive (XNR5516 HV, manufactured by Nagase ChemteX Corporation), to give a device of comparative example.

Example 1 (See FIG. 7)

A device according to the invention was prepared in the same manner as in Comparative Example 1, except that the layer structure and the vapor deposition of the luminescent layer in Comparative Example 1 were changed to those shown below.

(Configuration of Luminescent Layer)
—First Luminescent Material Layer—
Layer of CBP and Firpic at a ratio of 96 to 92:4 to 8 (%), thickness: 11 nm
—Mixed Region of the First Luminescent Material Layer and the Second Luminescent Material Layer—
Mixed region of CBP, Firpic, and Btp$_2$Ir(acac), thickness: 1 nm
—Second Luminescent Material Layer—
Layer of CBP and Btp$_2$Ir(acac) at a ratio of 96 to 92:4 to 8(%), thickness: 11 nm
—Mixed Region of the Second Luminescent Material Layer and the Third Luminescent Material Layer—
Mixed region of CBP, Btp$_2$Ir(acac) and Ir(ppy)$_3$, thickness: 1 nm
—Third Luminescent Material Layer—
Layer of CBP and Ir(Ppy)$_3$ at a ratio of 96 to 92:4 to 8 (%), thickness: 11 nm
(Vapor Deposition of Luminescent Layer)
The first luminescent material layer was vapor-deposited to a thickness of 11 nm on the hole-transporting layer obtained in the same manner as Comparative Example 1, while adjusting the deposition speeds of CBP and Firpic.

When the first luminescent material layer reached to a thickness of 10 nm during the vapor deposition, components for the second luminescent material layer, CBP and $Btp_2Ir$ (acac), were allowed to vapor-deposit. The second luminescent material layer was codeposited until the layer reached to a thickness of 11 nm (total thickness including the first luminescent material layer: 21 nm).

When the second luminescent material layer reached to a thickness of 10 nm (total thickness including the first luminescent material layer: 20 nm) during the vapor deposition, components for the third luminescent material layer, CBP and $Ir(ppy)_3$, were allowed to vapor-deposit. The third luminescent material layer was codeposited to a thickness of 11 nm (total thickness including the first luminescent material layer: 31 nm).

In this manner, a luminescent layer having the first to third luminescent material layers and the mixed regions thereof was formed.

Figure 8:
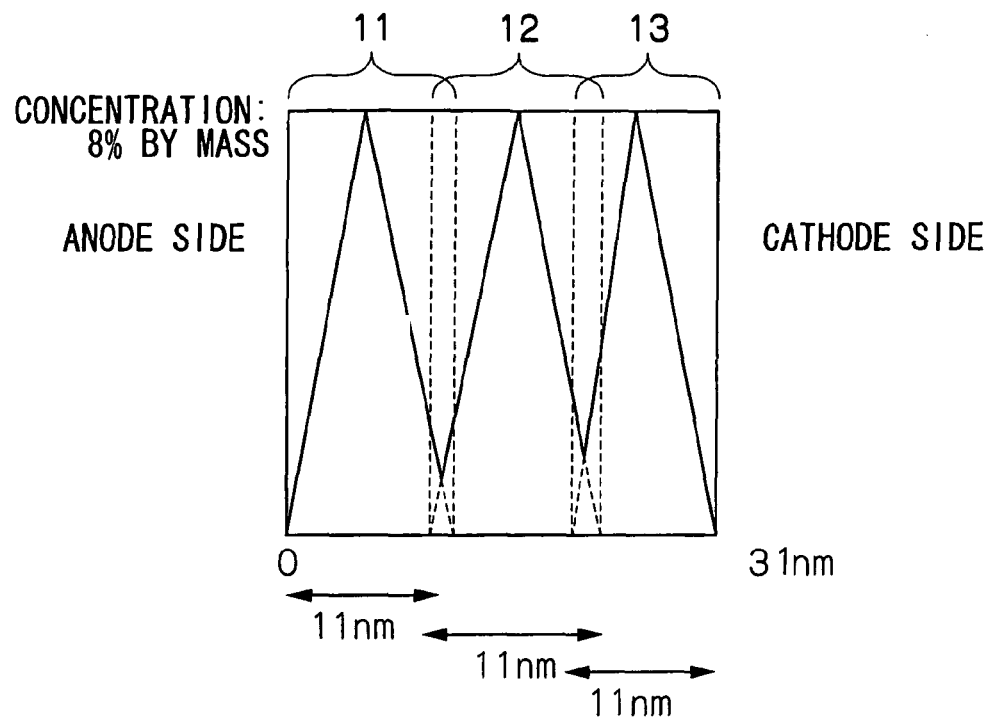
FIG. 8 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in the luminescent device of Example 2.

Example 2 (See FIG. 8)

A device according to the invention was prepared in the same manner as in Comparative Example 1, except that the layer structure and the vapor deposition of the luminescent layer in Comparative Example 1 were changed to those shown below.

(Configuration and Components for Luminescent Layer)
—First Luminescent Material Layer—
Layer of CBP and Firpic at a ratio 100 to 92:0 to 8 (%), thickness: 11 nm
—Mixed Region of the First Luminescent Material Layer and the Second Luminescent Material Layer—
Mixed region of CBP, Firpic and $Btp_2Ir(acac)$, thickness: 1 nm
—Second Luminescent Material Layer—
Layer of CBP and $Btp_2Ir(acac)$ at a ratio of 100 to 92:0 to 0 to 8 (%), thickness: 11 nm
—Mixed Region of the Second Luminescent Material Layer and the Third Luminescent Material Layers—
Mixed region of CBP, $Btp_2Ir(acac)$ and $Ir(ppy)_3$, thickness: 1 nm
—Third Luminescent Material Layer—
Layer of CBP and $Ir(Ppy)_3$ at a ratio of 92:8(%), thickness: 11 nm (Vapor Deposition of Luminescent Layer)
The first luminescent material layer was deposited on the hole-transporting layer obtained as described above, while making a slope of the change in the concentration (concentration gradient) in the first luminescent material layer by adjusting the deposition speeds of respective components in such a manner that the concentration ratio of CBP:Firpic became 100:0 when deposition of the first luminescent material layer was started and terminated and the concentration ratio of CBP:Firpic became 92:8 when the first luminescent material layer reached to a thickness of 5.5 nm.

The second luminescent material layer was allowed to deposit when the first luminescent material layer reached to a thickness of 10 nm. It was codeposited while making a slope of the change in the concentration in the second luminescent material layer by adjusting the deposition speeds of respective components in such a manner that the concentration ratio of $CBP:Btp_2Ir(acac)$ became 100:0 when deposition was initiated and terminated and the concentration ratio became 92:8 when the second luminescent material layer reached to a thickness of 5.5 nm (total thickness including the first luminescent material layer: 15.5 nm). A mixed layer of the first and second luminescent materials having a thickness of 1 nm was thus formed.

Deposition of the third luminescent material layer was started when the second luminescent material layer reached to a thickness of 10 nm (i.e., total thickness including the first luminescent material layer: 20 nm). It was codeposited while making a slope of the change in the concentration in the third luminescent material layer by adjusting the deposition speeds of respective components in such a manner that the concentration ratio of $CBP:Ir(Ppy)_3$ became 100:0 when the vapor deposition was initiated and terminated and the concentration ratio became 92:8 when the third luminescent material layer reached to a thickness of 5.5 nm (total thickness including the first luminescent material layer: 25.5 nm). A mixed layer containing the second and third luminescent materials having a thickness of 1 nm was then formed. In this manner, a luminescent layer having the first to third luminescent material layers and the respective mixed regions was formed.

These luminescent devices were evaluated by the following method:

The light-emitting capacity thereof was determined by using a source measure unit (trade name: MODEL 2400; manufactured by Toyo Corporation), while the luminescent device was made to emit light under application of a DC voltage. The maximum luminance then was designated as Lmax, the driving voltage at the maximum luminance was designated as Vmax, and the luminous efficiency at 1000 $Cd/m^2$ was designated as an external quantum efficiency ($\eta_{1000}$). Separately, the CIE1964 chromaticity coordinate pair (x, y) was also determined form the emission spectrum.

TABLE 1

|  | Lmax ($Cd/m^2$) | Vmax (V) | $\eta_{1000}$ | CIE chromaticity coordinate pair (x, y) |
|---|---|---|---|---|
| Comparative Example 1 | 36000 | 20 | 4.0% | (0.31, 0.35) |
| Example 1 | 78000 | 15 | 6.5% | (0.34, 0.34) |
| Example 2 | 85000 | 16 | 6.8% | (0.34, 0.33) |

Figure 9:
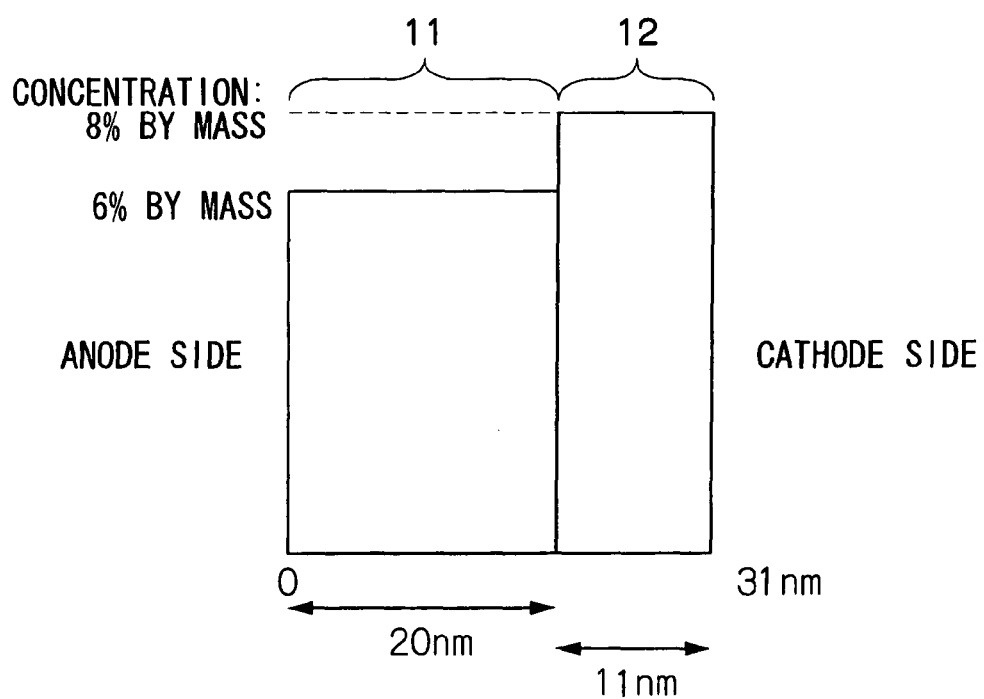
FIG. 9 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in the luminescent device of Comparative Example 2.

Comparative Example 2 (See FIG. 9)

A comparative device was prepared in the same manner as in Comparative Example 1, except that the organic layer structure in Comparative Example 1 was changed to that below.

Figure 10:
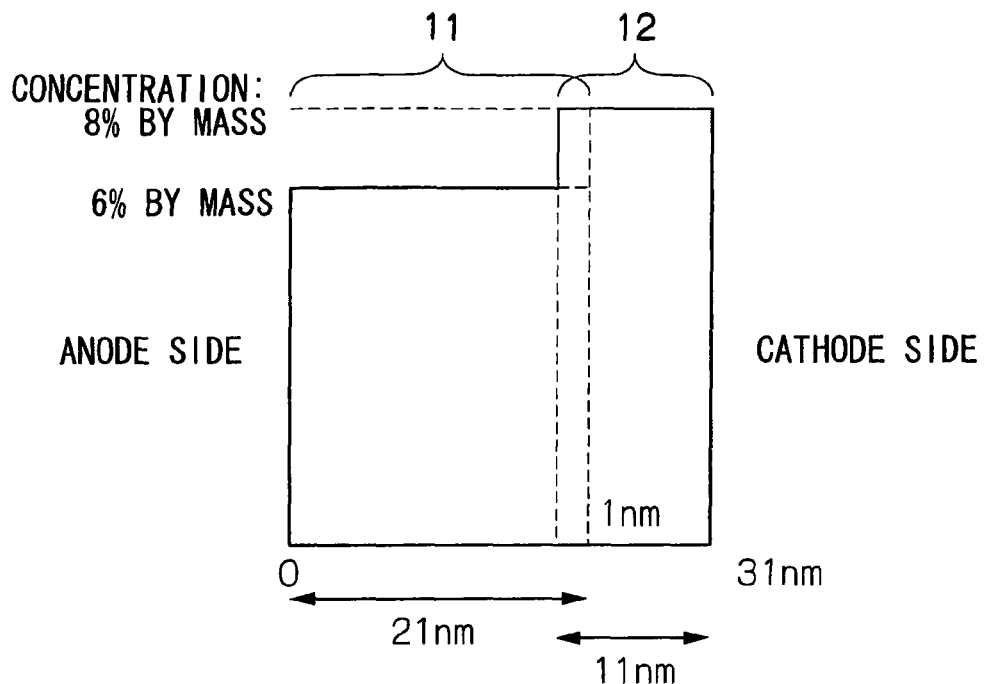
FIG. 10 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in the luminescent device of Example 3.

(Hole-Transporting Layer)
NPD, thickness: 40 nm
(Luminescent Layer)
—First Luminescent Material Layer—
Layer of CBP and Firpic at a ratio of 94:6 (%), thickness: 20 nm,
—Second Luminescent Material Layer—
Layer of CBP and $Btp_2Ir(acac)$ at a ratio of 92:8 (%), thickness: 11 nm
(Electron-Transporting Layer)
BCP, thickness: 10 nm Example 3 (See FIG. 10)

A comparative device was prepared in the same manner as in Comparative Example 2, except that the organic layer structure and the vapor deposition of the luminescent layer in Comparative Example 2 was changed to those below.

(Configuration and Components for Luminescent Layer)
—First Luminescent Material Layer—
Layer of CBP and Firpic at a ratio of 94 to 92:6 to 8 (%), thickness: 21 nm
—Mixed Region of the First Luminescent Material Layer and the Second Luminescent Material Layer—
Mixed region of CBP, Firpic and Btp$_2$Ir(acac), thickness: 1 nm
—Second Luminescent Material Layer—
Layer of CBP and Btp$_2$Ir(acac) at a ratio of 94 to 92:6 to 8 (%), thickness: 11 nm (Vapor Deposition of Luminescent Layer)

The first luminescent material layer having the composition as described above was deposited on the hole-transporting layer to a thickness of 21 nm by vapor deposition.

When the first luminescent material layer reached to a thickness of 20 nm during the vapor deposition, the components for the second luminescent material layer were allowed to deposit. The deposition was continued until the second luminescent material layer reached to a thickness of 11 nm (total thickness including the first luminescent material layer: 31 nm).

In this manner, a luminescent layer having the first and second luminescent material layers and the mixed region was formed.

Figure 11:
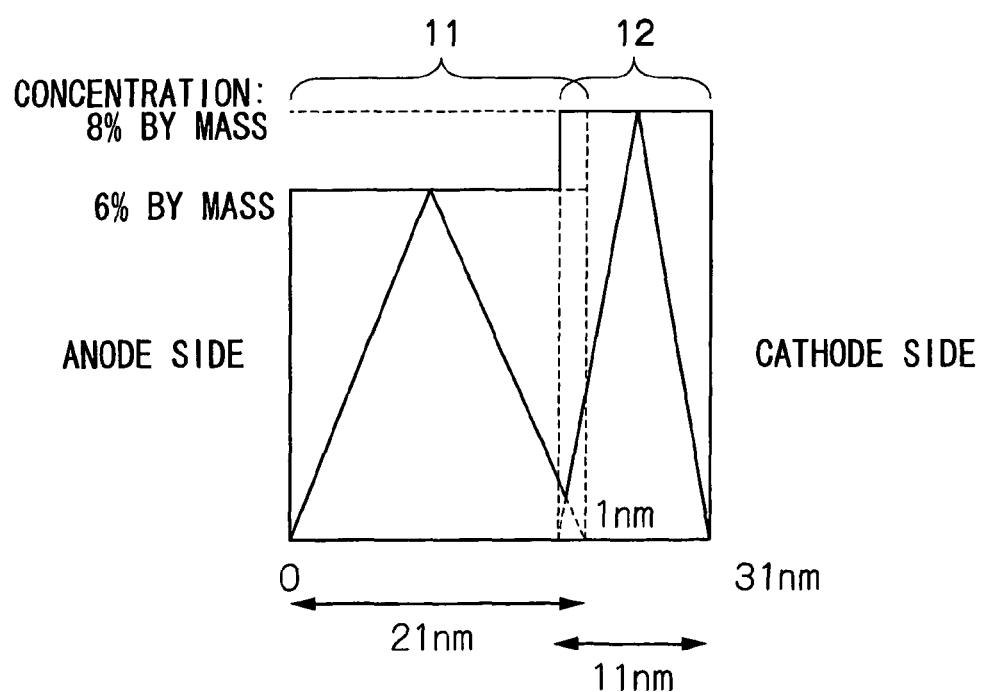
FIG. 11 is a schematic view illustrating the layer structure and the concentration distribution of luminescent materials in a luminescent layer, as the concentration (% by mass) of the luminescent material in the luminescent layer and the thickness of the luminescent layer are plotted respectively on the ordinate and the abscissa, in the luminescent device of Example 4.

Example 4 (See FIG. 11)

A device according to the invention was prepared in the same manner as in Comparative Example 2, except that the organic layer structure and the vapor deposition of the luminescent layer in Comparative Example 2 was changed to those below.

(Configuration and Components for Luminescent Layer)
—First Luminescent Material Layer—
Layer of CBP and Firpic at a ratio of 100 to 94:0 to 6 (%), thickness: 21 nm
—Mixed Region of the First Luminescent Material Layer and the Second Luminescent Material Layer—
Mixed region of CBP, Firpic and Btp$_2$Ir(acac), thickness: 1 nm
—Second Luminescent Material Layer—
Layer of CBP and Btp$_2$Ir(acac) at a ratio of 100 to 92:0 to 8 (%), thickness: 11 nm (Vapor Deposition of Luminescent Layer)

The first luminescent material layer was deposited on the hole-transporting layer while making a slope of the change in the concentration in the first luminescent material layer by controlling the deposition speeds of respective components in such a manner that the concentration ratio of CBP:Firpic became 100:0 when deposition of the first luminescent material layer was initiated and terminated and the concentration ratio of CBP:Firpic became 94:6 when the first luminescent layer reached to a thickness of 10.5 nm.

Deposition of the second luminescent material layer was initiated when the first luminescent material layer reached a thickness of 20 nm. It was codeposited while making a slope of the change in the concentration in the second luminescent layer by controlling the deposition speeds of respective components in such a manner that the concentration ratio of CBP:Btp$_2$Ir(acac) became 100:0 when the vapor deposition was initiated and terminated and the concentration ratio became 92:8 when the second luminescent material layer reached to a thickness of 5.5 nm (total thickness including the first luminescent material layer: 25.5 nm). A mixed layer of the first and second luminescent materials having a thickness of 1 nm was formed then.

In this manner, a luminescent layer having the first and second luminescent material layers and the mixed region thereof was formed.

These luminescent devices thus obtained were evaluated in the same manner as in Example 1. Results are summarized in Table 2.

TABLE 2

| | Lmax (Cd/m$^2$) | Vmax (V) | $\eta_{1000}$ | CIE chromaticity coordinate pair (x, y) |
|---|---|---|---|---|
| Comparative Example 2 | 34000 | 21 | 2.2% | (0.30, 0.41) |
| Example 3 | 68000 | 15 | 5.7% | (0.33, 0.36) |
| Example 4 | 72000 | 17 | 5.9% | (0.35, 0.36) |

As apparent from the results in Tables 1 and 2, the luminescent devices of Examples 1 to 4 of the invention, which have a region containing one luminescent material and a region containing two luminescent materials in the luminescent layer, were drastically superior in luminance, luminous efficiency, driving voltage, and chromaticity to the luminescent devices of Comparative Examples 1 and 2 that had a plurality of regions containing only one luminescent material.

The luminescent devices of the invention can also be prepared by using rubrene (red phosphorescent material) instead of using Btp$_2$Ir (red phosphorescent material) in Examples 1 to 4.

The invention provides organic EL devices having high luminous efficiency and luminance as well as superior chromaticity.

What is claimed is:

1. An organic electroluminescent device comprising one or more organic compound layers between a pair of electrodes, the one or more organic compound layers comprising at least a luminescent layer, wherein
   (a) a host material and two different luminescent materials including at least one phosphorescent material are contained in the same luminescent layer, and
   (b) the luminescent layer has:
      (1) a layer containing the host material and the first luminescent material,
      (2) a layer containing the host material and the first and second luminescent materials, and having a thickness of 0.5 nm to 10 nm, and
      (3) a layer containing the host material and the second luminescent material
   that are arranged adjacently, laying side-by-side, formed in this order in the thickness direction from an anode side of the luminescent layer.

2. The organic electroluminescent device of claim 1, wherein the concentration of at least one luminescent material in the luminescent layer is increasing and/or decreasing gradually from an anode side in the thickness direction.

3. The organic electroluminescent device of claim 1, wherein the concentration of at least one luminescent material in the luminescent layer is increasing and/or decreasing gradually from the anode side in the thickness direction.

4. The organic electroluminescent device of claim 1, wherein the organic electroluminescent device emits a white light.

5. The organic electroluminescent device of claim 1, wherein the phosphorescent material is an orthometalated metal complex or a porphyrin metal complex.

6. The organic electroluminescent device of claim 1, wherein the at least two different luminescent materials emit lights different in emission wavelength.

7. The organic electroluminescent device of claim 1, wherein the concentration of luminescent materials in the layer containing the first and second luminescent materials is 0.5% by mass to 5% by mass.

* * * * *